United States Patent
Kidron et al.

(10) Patent No.: US 12,455,512 B2
(45) Date of Patent: Oct. 28, 2025

(54) PNEUMATIC CONTROLLED FLEXURE SYSTEM FOR STABILIZING A PROJECTION DEVICE

(71) Applicant: Applied Materials, Inc., Santa Clara, CA (US)

(72) Inventors: Assaf Kidron, Cupertino, CA (US); Jiawei Shi, Santa Clara, CA (US); Liang-Yu Chen, Taipei (TW); Che-Kai Chang, Santa Clara, CA (US); Tsu-Hui Yang, Dongkung Town (TW); Nimrod Smith, Cupertino, CA (US); Grant Wang, Cupertino, CA (US); Preston Fung, Daly City, CA (US); Vasuman Ghanapaati Srirangarajan, Karnataka (IN); Davidi Kalir, Santa Clara, CA (US); Rudolf C. Brunner, Santa Clara, CA (US)

(73) Assignee: Applied Materials, Inc., Santa Clara, CA (US)

(*) Notice: Subject to any disclaimer, the term of this patent is extended or adjusted under 35 U.S.C. 154(b) by 108 days.

(21) Appl. No.: 18/261,150

(22) PCT Filed: Feb. 1, 2022

(86) PCT No.: PCT/US2022/014690
§ 371 (c)(1),
(2) Date: Jul. 12, 2023

(87) PCT Pub. No.: WO2022/169742
PCT Pub. Date: Aug. 11, 2022

(65) Prior Publication Data
US 2024/0069452 A1 Feb. 29, 2024

(30) Foreign Application Priority Data
Feb. 3, 2021 (IN) .............................. 202141004605

(51) Int. Cl.
*G03F 7/00* (2006.01)

(52) U.S. Cl.
CPC ...... *G03F 7/70833* (2013.01); *G03F 7/70275* (2013.01); *G03F 7/709* (2013.01)

(58) Field of Classification Search
CPC ............... G03F 7/2057; G03F 7/70275; G03F 7/70833; G03F 7/709; F16F 9/05; F16F 9/084
See application file for complete search history.

(56) References Cited

U.S. PATENT DOCUMENTS

2018/0129142 A1 5/2018 Johnston et al.
2018/0259860 A1 9/2018 Hazelton et al.
(Continued)

FOREIGN PATENT DOCUMENTS

KR 100699241 B1 * 3/2007 ......... G03F 7/70225
WO 2019206517 A1 10/2019

OTHER PUBLICATIONS

International Search Report/Written Opinion issued to PCT/US2022/014690 on May 16, 2022.

*Primary Examiner* — Peter B Kim
(74) *Attorney, Agent, or Firm* — Patterson + Sheridan, LLP (57) ABSTRACT

Embodiments of the present disclosure relate to projection stabilization systems and maskless lithography systems having projection stabilization systems. The projection stabilization system compensates for propagating vibrations that move image projection systems (IPS's). The IPS's are in a processing position prior to operation of the maskless lithography process. One or more stiffeners are coupled to the IPS. The one or more stiffeners apply pressure to flexures coupled to each stiffener. The flexures are coupled to the IPS to provide stabilization to the IPS during the operations of the maskless lithography process. For example, the one or more
(Continued)

of stiffeners protect the IPS from vibrations that propagate through the system during operation.

20 Claims, 3 Drawing Sheets

(56) References Cited

U.S. PATENT DOCUMENTS

2019/0121243 A1 4/2019 Shibazaki
2019/0369499 A1 12/2019 Lai et al.

\* cited by examiner

PNEUMATIC CONTROLLED FLEXURE SYSTEM FOR STABILIZING A PROJECTION DEVICE

BACKGROUND

Field

Embodiments of the present disclosure generally relate to lithography systems. More particularly, embodiments of the present disclosure relate to projection stabilization systems and maskless lithography systems having projection stabilization systems.

Description of the Related Art

Photolithography is widely used in the manufacturing of semiconductor devices, such as for back-end processing of semiconductor devices, and display devices, such as liquid crystal displays (LCDs). For example, large area substrates are often utilized in the manufacture of LCDs. LCDs, or flat panel displays, are commonly used for active matrix displays, such as computers, touch panel devices, personal digital assistants (PDAs), cell phones, television monitors, and the like. Generally, flat panel displays include a layer of liquid crystal material as a phase change material at each pixel, sandwiched between two plates. When power from a power supply is applied across or through the liquid crystal material, an amount of light passing through the liquid crystal material is controlled, i.e., selectively modulated, at the pixel locations enabling images to be generated on the display.

A conventional maskless lithography system utilizes a plurality of image projection systems. Each image projection system has a spatial light modulator configured to project a plurality of write beams into a photoresist layer on a surface of the substrate. A pattern, also known as a mask pattern, is written into the photoresist layer on the surface of the substrate by the write beams projected by the image projection system. However, during operation of the maskless lithography system, vibrations may propagate throughout the maskless lithography system, which can alter the position of the image projection systems. This movement can lead to mura or other undesirable effects in the mask pattern.

Accordingly, what is needed in the art are projection stabilization systems and maskless lithography systems having projection stabilization systems.

SUMMARY

In one embodiment, a system is provided. The system includes a pair of bridges. Each bridge is disposed in a vertical direction adjacent to the other. The system further includes a stiffener mount coupled to a first bridge of the pair of bridges and a joint coupled to a second bridge of the pair of bridges. The system further includes an upper base coupled to an upper portion of the stiffener mount, an upper stiffener flexure disposed on the upper base and an upper stiffener coupled to the upper portion of the stiffener mount. The upper stiffener includes an upper pneumatic cylinder positioned above the upper stiffener flexure. The system further includes a lower base coupled to a lower portion of the stiffener mount, a lower stiffener flexure disposed on the lower base, and a lower stiffener coupled to the lower portion of the stiffener mount. The lower stiffener includes a lower pneumatic cylinder positioned above the lower stiffener flexure. The lower stiffener flexure is perpendicular to the joint.

In another embodiment, a system is provided. The system includes a stiffener mount, an upper base coupled to an upper portion of the stiffener mount, an upper stiffener flexure disposed on the upper base, and an upper stiffener coupled to the upper portion of the stiffener mount. The upper stiffener includes an upper pneumatic cylinder positioned above the upper stiffener flexure. The system further includes a lower base coupled to a lower portion of the stiffener mount, a lower stiffener flexure disposed on the lower base, and a lower stiffener coupled to the lower portion of the stiffener mount. The lower stiffener includes a lower pneumatic cylinder positioned above the lower stiffener flexure.

In yet another embodiment, a system is provided. The system includes a plurality of image projection systems disposed between a first bridge and a second bridge. Each image projection system (IPS) has a joint coupled to the second bridge. The system further includes a plurality of projection stabilization systems. Each projection stabilization system is coupled to a respective IPS. Each projection stabilization system includes one or more stiffeners. Each stiffener includes a housing coupled to the first bridge with a stiffener mount. The housing has a pneumatic cylinder disposed therein. The stiffener further includes a base coupled to the housing. The system further includes one or more flexures. Each flexure is coupleable to the base of the respective stiffener and an IPS mount of the respective IPS. Each flexure is perpendicular to the joint coupling the respective IPS to the second bridge.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only exemplary embodiments and are therefore not to be considered limiting of its scope, and may admit to other equally effective embodiments.

To facilitate understanding, identical reference numerals have been used, where possible, to designate identical elements that are common to the figures. It is contemplated that elements and features of one embodiment may be beneficially incorporated in other embodiments without further recitation.

DETAILED DESCRIPTION

Embodiments described herein provide projection stabilization systems and maskless lithography systems having projection stabilization systems. In one embodiment, a system is provided. The system includes a stiffener. The stiffener includes a housing coupleable to a support bridge with a stiffener mount. The housing has a pneumatic cylinder disposed therein. The stiffener further includes a base coupled to the housing. The system further includes a flexure coupleable to an image projection system (IPS) mount of an IPS coupled to an IPS bridge and coupleable to the base of the housing. The flexure when coupled to the IPS and the base is perpendicular to a joint that couples the IPS to a IPS bridge. The pneumatic cylinder is operable to engage or disengage from the flexure when the flexure is coupled to the IPS mount and the base.

Figure 1:
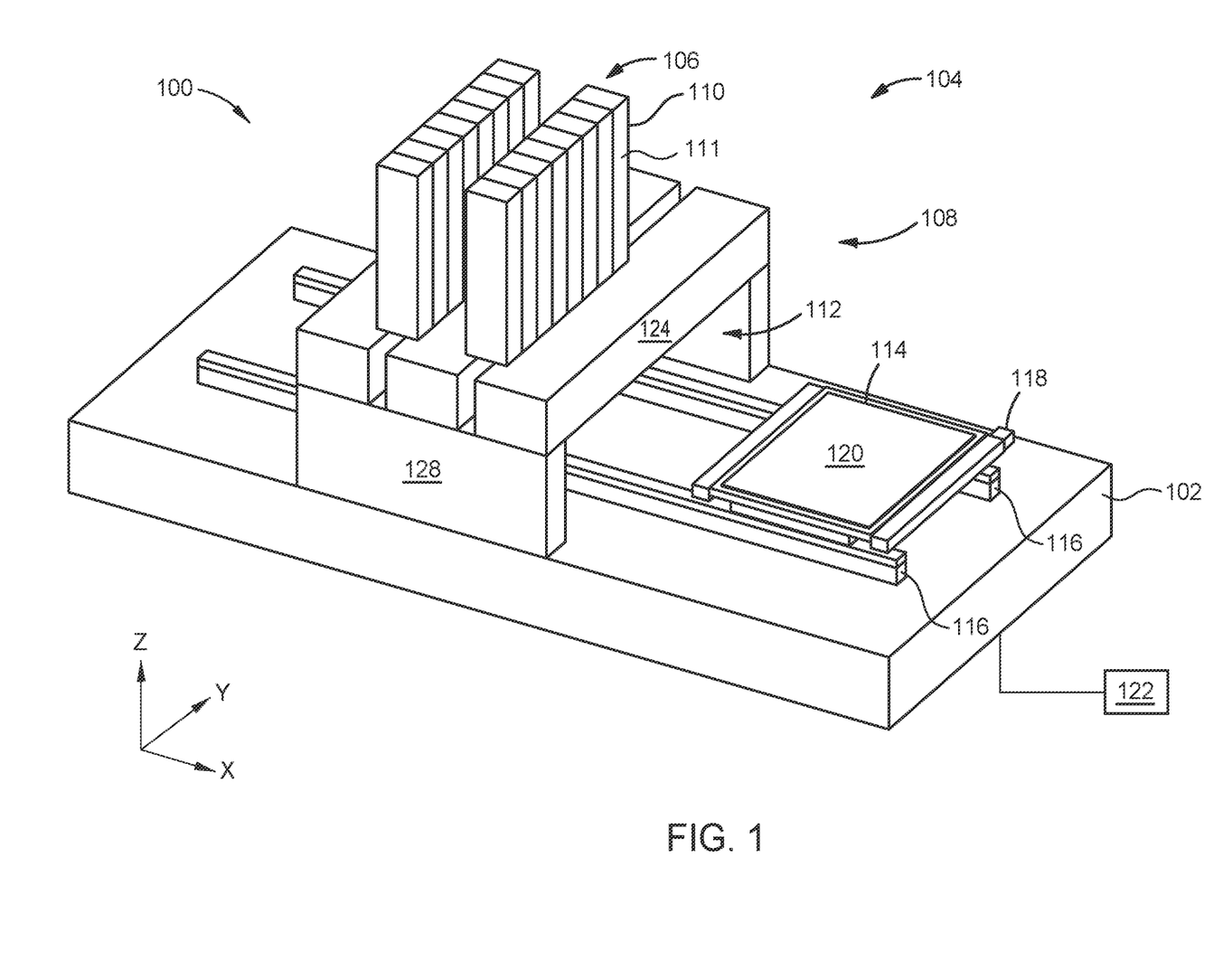
FIG. 1 is a perspective view of a maskless lithography system according to embodiments.

FIG. 1 is a perspective view of a maskless lithography system 100, that may benefit from embodiments described herein. The maskless lithography system 100 includes a stage 114 and a processing apparatus 104. The stage 114 is supported by a pair of tracks 116 disposed on a slab 102. A substrate 120 is supported by the stage 114. The stage 114 moves along the pair of tracks 116 in the X direction as indicated by the coordinate system shown in FIG. 1. The stage 114 also moves in the Y-direction for processing and/or indexing a substrate 120. The stage 114 is capable of independent operation and can scan the substrate 120 in one direction and step in the other direction. In one embodiment, which can be combined with other embodiments described herein, the pair of tracks 116 is a pair of parallel magnetic channels. As shown, each track of the pair of tracks 116 extends in a straight line path. An encoder 118 is coupled to the stage 114 in order to provide information of the location of the stage 114 to a controller 122.

The controller 122 is generally designed to facilitate the control and automation of the processing techniques described herein. The controller 122 may be coupled to or in communication with the processing apparatus 104, the stage 114, and the encoder 118. The processing apparatus 104 and the encoder 118 may provide information to the controller 122 regarding the substrate processing and the substrate aligning. For example, the processing apparatus 104 may provide information to the controller 122 to alert the controller 122 that substrate processing has been completed. A program (or computer instructions), which may be referred to as an imaging program, readable by the controller 122, determines which tasks are performable on a substrate. The program includes a mask pattern data and code to monitor and control the processing time and substrate position. The mask pattern data corresponding to a pattern to be written into the photoresist using the electromagnetic radiation.

The substrate 120 comprises any suitable material, for example, glass, which is used as part of a flat panel display. In other embodiments, the substrate 120 is made of other materials capable of being used as a part of the flat panel display. The substrate 120 has a film layer to be patterned formed thereon, such as by pattern etching thereof, and a photoresist layer formed on the film layer to be patterned, which is sensitive to electromagnetic radiation, for example UV or deep UV "light". A positive photoresist includes portions of the photoresist, when exposed to radiation, are respectively soluble to a photoresist developer applied to the photoresist after the pattern is written into the photoresist using the electromagnetic radiation. A negative photoresist includes portions of the photoresist, when exposed to radiation, will be respectively insoluble to photoresist developer applied to the photoresist after the pattern is written into the photoresist using the electromagnetic radiation. The chemical composition of the photoresist determines whether the photoresist is a positive photoresist or negative photoresist. After exposure of the photoresist to the electromagnetic radiation, the resist is developed to leave a patterned photoresist on the underlying film layer. Then, using the patterned photoresist, the underlying thin film is pattern etched through the openings in the photoresist to form a portion of the electronic circuitry of the display panel.

The processing apparatus 104 includes a support 108 and a processing unit 106. The support 108 includes a pair of risers 128, disposed on the slab 102, supporting two or more bridges 124. The pair of risers 128 and bridges 124 form an opening 112 for the pair of tracks 116 and the one or more stages 114 to pass under the processing unit 106. The processing unit 106 is supported by the support 108. The processing unit 106 includes a plurality of image projection systems (IPS's) 110. Each IPS 110 is disposed in a case 111. Each IPS 110 is supported by adjacent bridges 124.

While FIG. 1 shows three bridges 124 supporting two rows of IPS's 110, the maskless lithography system 100 may include two bridges 124 disposed on the pair of risers 128 supporting a single row of IPS's 110. In one embodiment, which can be combined with other embodiments described herein, the processing unit 106 contains as many as 84 IPS's 110. Each IPS 110 includes a spatial light modulator. The spatial light modulator includes, but is not limited to, microLEDs, OLEDs, digital micromirror devices (DMDs), liquid crystal displays (LCDs), and vertical-cavity surface-emitting lasers (VCSELs). The components of each of the IPS 110 vary depending on the spatial light modulator being used.

Figure 2A:
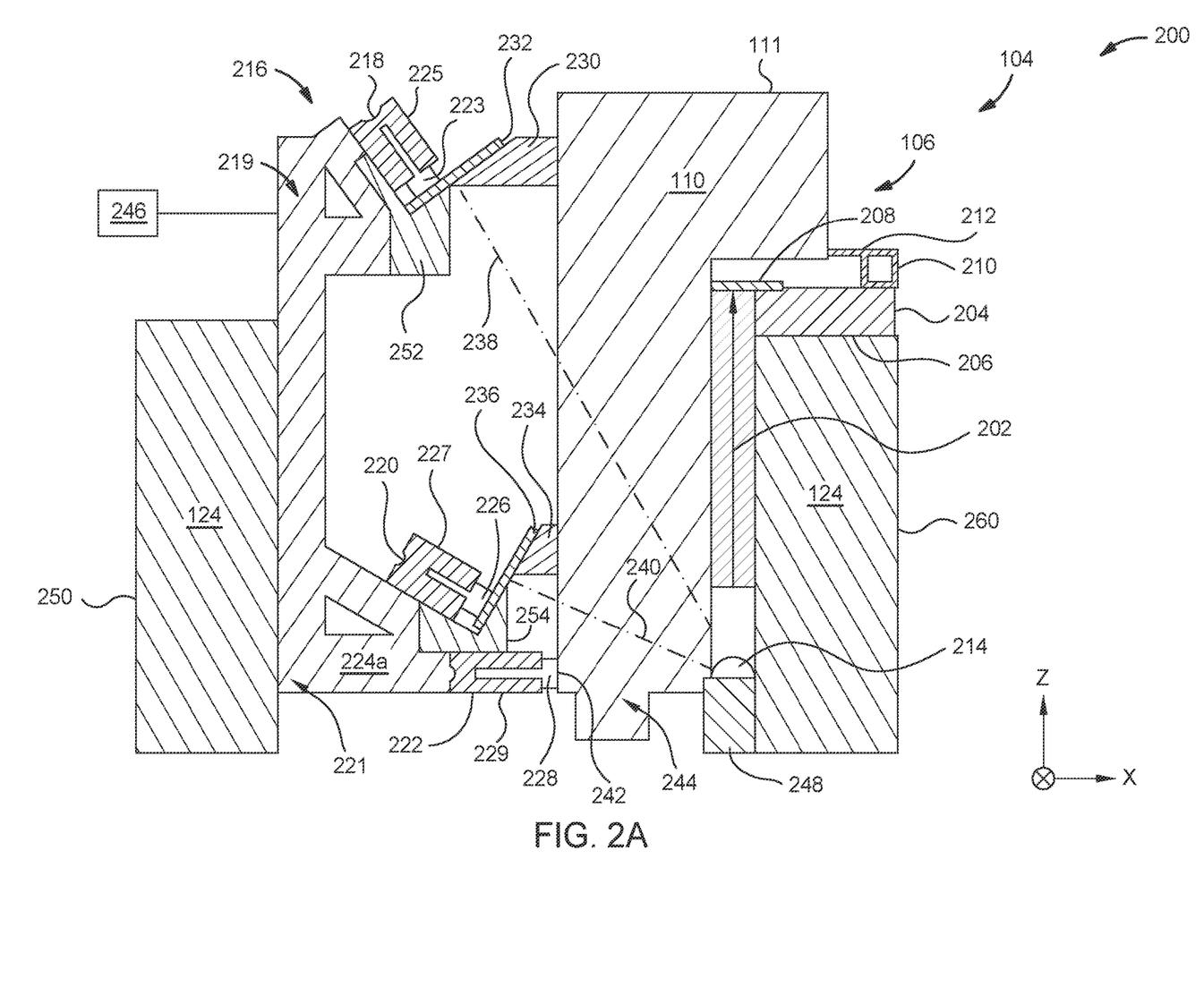
FIGS. 2A and 2B are schematic, side views of an image projection system having a projection stabilization system according to embodiments.
Figure 2B:
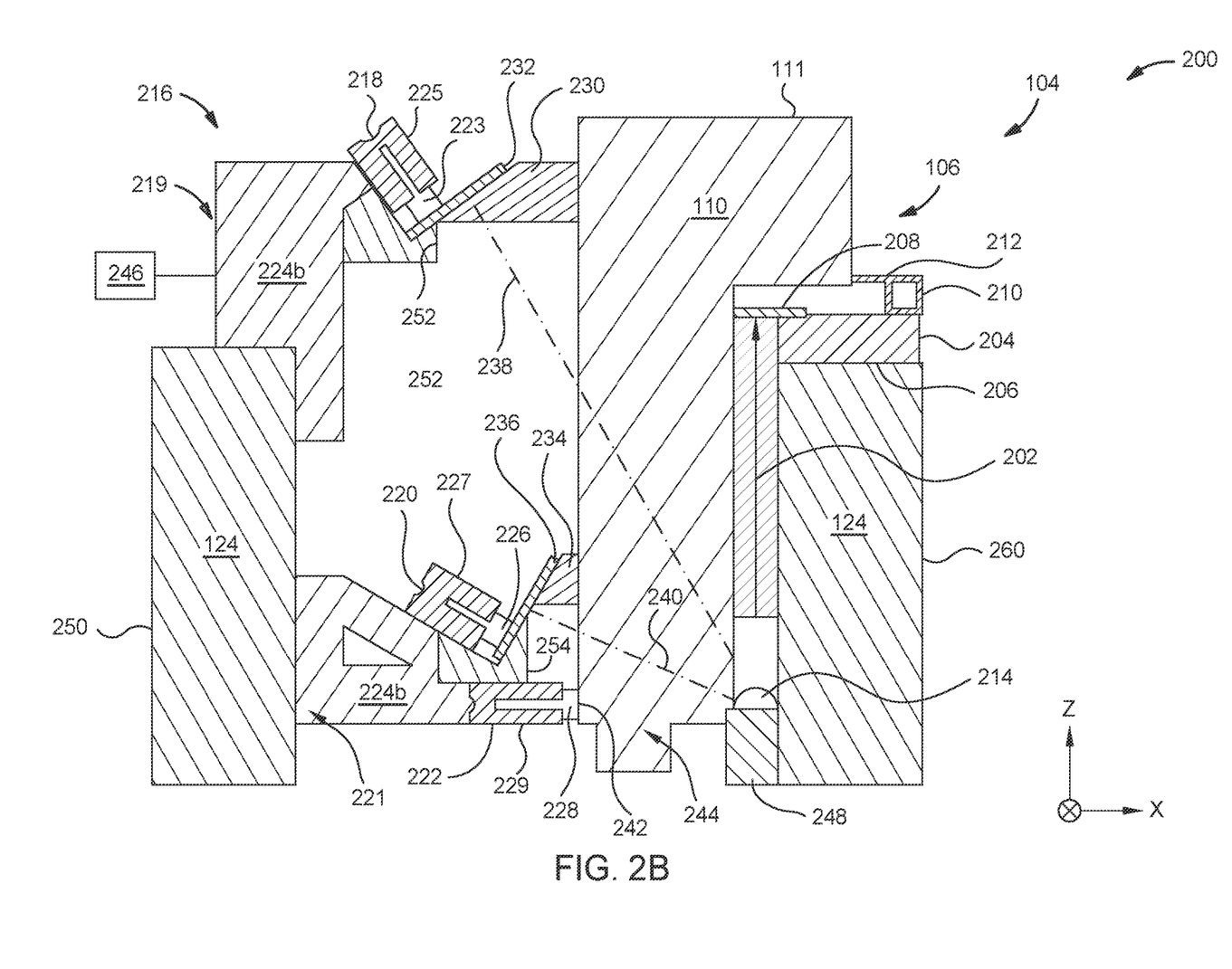

FIGS. 2A and 2B are schematic, side-views of an image projection system (IPS) 110 having a projection stabilization system 200. To facilitate explanation, the projection stabilization system 200 will be described with reference to the maskless lithography system 100 of FIG. 1. However, it is to be noted that maskless lithography systems, or other lithography systems utilizing IPS's 110 may be utilized in conjunction with the projection stabilization system 200.

An IPS 110 is disposed between adjacent bridges 124. One of the adjacent bridges 124 is a support bridge 250. The other adjacent bridge 124 is an IPS bridge 260. As shown in FIGS. 2A and 2B, a stiffener mount 224a or a stiffener mount 224b is coupled to the support bridge 250. The IPS 110 is also coupled to a joint 214. The joint 214 is coupled to the IPS bridge 260 with a joint mount 248. In one embodiment, which can be combined with other embodiments described herein, the joint 214 is a ball joint. As shown, the IPS 110 is disposed between the joint 214, the IPS bridge 260, and the support bridge 250. The support bridge 250 and the IPS bridge 260 are disposed vertically in the z direction.

The IPS 110 is coupled to a Z stage 202. In one embodiment, which can be combined with other embodiments described herein, the Z stage 202 is in direct contact with the IPS 110. The Z stage 202 moves in the Z direction such that the IPS 110 moves in the Z direction as indicated by the coordinate system shown in FIGS. 2A and 2B. The Z stage 202 moves in the Z direction to adjust the IPS 110 as desired.

The processing apparatus 104 includes an XY stage 204. The IPS 110 is coupled to the XY stage 204. The XY stage 204 is disposed on an upper surface 206 of the IPS bridge 260. The XY stage 204 moves in the X direction and the Y direction such that the IPS 110 rotates about the X axis and the Y axis as indicated by the coordinate system shown in FIGS. 2A and 2B. The XY stage 204 moves along the upper surface 206 of the IPS bridge 260 to adjust the IPS 110 as desired. The XY stage 204 is coupled to the IPS 110 with a stage flexure 208. The stage flexure 208 allows the IPS 110 to move in the Z direction while remaining coupled to the XY stage 204. In one embodiment, which can be combined with other embodiments described herein, the stage flexure 208 is a metallic material. For example, the stage flexure 208 is a stainless steel. The stage flexure 208 can move about ±0.8 mm in the Z direction. In another embodiment, which can be combined with other embodiments described herein, the stage flexure 208 includes a thickness of about 0.1 mm.

The projection stabilization system 200 includes a rear block 210. The rear block 210 includes an interface flexure 212. The interface flexure 212 is coupled to the IPS 110. The interface flexure 212 stabilizes the IPS 110 during operation. The interface flexure 212 also allows the IPS 110 to move in the Z direction while remaining coupled to the XY stage 204. In one embodiment, which can be combined with other embodiments described herein, the interface flexure 212 is a metallic material. For example, the interface flexure 212 is a stainless steel. In another embodiment, which can be combined with other embodiments described herein, the interface flexure 212 includes multiple layers of flexures stacked together to form the interface flexure 212. For example, the interface flexure 212 can include eight or more flexures stacked together. Each flexure includes a thickness of about 0.1 mm. The interface flexure 212 can move in the Z direction about ±0.8 mm. The rear block 210 is disposed on the XY stage 204. The weight of the rear block 210 and the interface flexure 212 is applied to the XY stage 204. The weight of the rear block 210 provides sufficient static friction with the XY stage 204 such that the rear block 210 remains in contact with the XY stage. In yet another embodiment, which can be combined with other embodiments described herein, the rear block 210 is freely mounted on the XY stage 204.

The joint 214 allows the IPS 110 to move with three degrees of freedom, while remaining coupled to the IPS bridge 260. Prior to operation, the IPS 110 is moved into a processing position. The processing positon is the position that enables the mask pattern data corresponding to a pattern to be written into the photoresist using the electromagnetic radiation. The processing position includes a Z position, a tilt position, and a tip position. The Z position corresponds to the location of the Z stage 202 in the Z direction as indicated by the coordinate system shown in FIGS. 2A and 2B. The tip position corresponds to the rotation angle of the IPS 110 about the Y axis. The XY stage 204 is positioned at a pre-determined location in the X direction such that the IPS 110 is in the tip position. The tilt position corresponds to the rotation angle of the IPS 110 about the X axis. The XY stage 204 is positioned at a pre-determined location in the Y direction such that the IPS 110 is in the tilt position.

During operation of the maskless lithography system 100, vibrations propagate from the IPS 110 during the patterning of the mask pattern. The vibrations can move the IPS 110 out of the pre-determined processing positon. The movement out of the processing position can lead to mura or other undesirable effects in the patterning of the mask pattern. Therefore, the maskless lithography system includes the projection stabilization system 200 to retain the IPS 110 in the processing positon during operation despite the vibrations.

As shown in FIGS. 2A and 2B, the projection stabilization system 200 includes one or more stiffeners 216. Each projection stabilization system 200 is coupled to an IPS 110 of the plurality of IPS 110. In one embodiment, which can be combined with other embodiments described herein, the one or more stiffeners 216 includes an upper stiffener 218, a lower stiffener 220, and a lens stiffener 222.

The one or more stiffeners 216 are each coupled to the support bridge 250 opposite of the IPS bridge 260. The one or more stiffeners 216 are each disposed between the support bridge 250 and the IPS 110. As shown in FIG. 2A, the upper stiffener 218, the lower stiffener 220, and the lens stiffener 222 are coupled to the support bridge 250 with a stiffener mount 224*a*. As shown in FIG. 2B, the upper stiffener 218, the lower stiffener 220, and the lens stiffener 222 are coupled to the support bridge 250 with a stiffener mount 224*b*. The upper stiffener 218 is coupled to an upper portion 219 of the stiffener mount 224*a*, 224*b*. The lower stiffener 220 is coupled to a lower portion 221 of the stiffener mount 224*a*, 224*b* below the upper portion 219.

The upper stiffener 218 includes an upper pneumatic cylinder 223 and an upper housing 225. The upper pneumatic cylinder 223 is disposed in the upper housing 225. An upper base 252 is coupled to the upper housing 225 of the upper stiffener 218. The upper base 252 is also coupled to the upper portion 219 of the stiffener mount 224*a*, 224*b*. As such, the upper housing 225 is coupled to the stiffener mount 224*a*, 224*b* and the upper base 252. The stiffener mount 224*a*, 224*b* and the upper base 252 support the upper housing 225 and the upper pneumatic cylinder 223 disposed therein. The stiffener mount 224*a*, 224*b* and the upper base 252 hold the upper housing 225.

An upper IPS mount 230 is positioned proximate the upper pneumatic cylinder 223. The upper IPS mount 230 is coupled to the IPS 110 and retains an upper stiffener flexure 232. The upper stiffener flexure 232 is coupleable to the upper base 252 and the upper IPS mount 230. In one embodiment, which can be combined with other embodiments described herein, the upper stiffener flexure 232 is a metallic material. For example, the upper stiffener flexure 232 is a stainless steel. In another embodiment, which can be combined with other embodiments described herein, the upper stiffener flexure 232 includes multiple layers of flexures stacked together. In yet another embodiment, which can be combined with other embodiments described herein, the upper stiffener flexure 232 includes a stack of multiple flexures that each include a thickness of about 0.1 mm. For example, the upper stiffener flexure 232 can include eight flexures. The upper IPS mount 230 and the upper base 252 retain the upper stiffener flexure 232 such that the upper stiffener flexure 232 is in front of a face of the upper pneumatic cylinder 223. In one embodiment, which can be combined with other embodiments described herein, the upper stiffener flexure 232 is about 0.5 mm from the upper pneumatic cylinder 223.

The upper housing 225 houses the upper pneumatic cylinder 223 such that the upper pneumatic cylinder 223 is engaged to apply pressure on the upper stiffener flexure 232 or disengaged and free of the upper stiffener flexure 232. The upper stiffener flexure 232 is compressed between the upper pneumatic cylinder 223 and the upper base 252. The upper pneumatic cylinder 223 applies pressure to the upper stiffener flexure 232 when engaged such that the IPS 110 is retained in the processing positon despite vibrations. The vibrations in the Y direction create mura, thus the upper stiffener flexure 232 provides stabilization in the in-plane direction i.e., the Y direction.

The lower stiffener 220 includes a lower pneumatic cylinder 226 and a lower housing 227. The lower pneumatic cylinder 226 is disposed in the lower housing 227. A lower base 254 is coupled to the lower housing 227 of the lower stiffener 220. The lower base 254 is also coupled to the lower portion 221 of the stiffener mount 224*a*, 224*b*. As such, the lower housing 227 is coupled to the stiffener mount 224*a*, 224*b* and the lower base 254. The stiffener mount 224*a*, 224*b* and the lower base 254 support the lower housing 227 and the lower pneumatic cylinder 226 disposed therein. The stiffener mount 224*a*, 224*b* and the lower base 254 hold the lower housing 227.

A lower IPS mount 234 is positioned proximate the lower pneumatic cylinder 226. The lower IPS mount 234 is coupled to the IPS 110 and retains a lower stiffener flexure 236. The lower stiffener flexure 236 is coupleable to the lower base 254 and the lower IPS mount 234. In one embodiment, which can be combined with other embodiments described herein, the lower stiffener flexure 236 is a metallic material. For example, the lower stiffener flexure 236 is a stainless steel. In another embodiment, which can be combined with other embodiments described herein, the lower stiffener flexure 236 includes multiple layers of flexures. In yet another embodiment, which can be combined with other embodiments described herein, the lower stiffener flexure 236 includes a stack of multiple flexures that each include a thickness of about 0.1 mm. For example, the lower stiffener flexure 236 can include eight flexures. The lower IPS mount 234 and the lower base 254 retain the lower stiffener flexure 236 such that the lower stiffener flexure 236 is in front of a face of the lower pneumatic cylinder 226. In one embodiment, which can be combined with other embodiments described herein, the lower stiffener flexure 236 is about 0.5 mm from the lower pneumatic cylinder 226.

The lower housing 227 houses the lower pneumatic cylinder 226 such that the lower pneumatic cylinder 226 is engaged to apply pressure on the lower stiffener flexure 236 or disengaged and free of the lower stiffener flexure 236. The lower stiffener flexure 236 is compressed between lower pneumatic cylinder 226 and the lower base 254. The lower pneumatic cylinder 226 applies pressure to the lower stiffener flexure 236 such that the IPS 110 with the spatial light modulator is retained in the pre-set positon despite vibrations. The vibrations in the Y direction create mura, thus the lower stiffener flexure 236 provides stabilization in the in-plane direction, i.e., the Y direction.

In combination, the one or more stiffeners 216 (e.g., the upper stiffener 218 and the lower stiffener 220) provide stability in the in-plane direction while allowing flexing in the out-of-plane directions (e.g., the X direction and the Z direction) such that the IPS 110 is stable and does not move due to the reaction forces from the extraction of the lower pneumatic cylinder 226 and the upper pneumatic cylinder 223.

The upper stiffener flexure 232 is perpendicular to the joint 214 coupled to the IPS bridge 260, as shown by the first vector 238 in FIGS. 2A and 2B. The first vector 238 from the joint 214 to the upper stiffener flexure 232 is perpendicular to the upper stiffener flexure 232. The first vector is at a first angle between about 5° and about 85° relative to the X direction. For example, the first angle is between about 10° and about 80°, between about 15° and about 75°, between about 20° and about 70°, between about 25° and about 65°, between about 30° and about 60°, between about 35° and about 55°, and between about 40° and about 50°.

The lower stiffener flexure 236 is perpendicular to the joint 214 coupled to the IPS bridge 260, as shown by the second vector 240 in FIGS. 2A and 2B. The second vector 240 from the joint 214 to the lower stiffener flexure 236 is perpendicular to the lower stiffener flexure 236. The second vector is at a second angle between about 5° and about 85° relative to the X direction. For example, the second angle is between about 10° and about 80°, between about 15° and about 75°, between about 20° and about 70°, between about 25° and about 65°, between about 30° and about 60°, between about 35° and about 55°, and between about 40° and about 50°.

The first vector 238 and the second vector 240 intersect at the joint 214. When the first vector 238 and the second vector 240 intersect at the joint 214, additional reaction forces from the one or more stiffeners 216 are minimized. Therefore, the reaction forces are less likely to move the IPS 110 out of the processing positon. Additionally, the stabilization of the IPS 110 improves when the first vector 238 and the second vector 240 intersect at the joint 214 due to the force being applied to a common point where the IPS 110 is stationary.

The stiffener mount 224a of FIG. 2A and the stiffener mount 224b of FIG. 2B can be configured in any way such that the first vector 238 and the second vector 240 intersect at the joint 214. It is to be noted that any configuration of the stiffener mount 224a and 224b may be utilized to positon the one or more stiffeners 216 as desired. The stiffener mount 224a and the stiffener mount 224b are configured such that the upper stiffener 218, the lower stiffener 220, and the lens stiffener 222 can be positioned relative to the IPS 110 as desired so long as the first vector 238 and the second vector 240 intersect at the joint 214 such that the upper stiffener flexure 232 and the lower stiffener flexure 236 are perpendicular to the joint 214. In one example, the lens stiffener 222 applies the force to the lens 244 such that the force is directed to the joint 214. The stiffener mount 224b includes the upper portion 219 and the lower portion 221 separated. The stiffener mount 224a includes the upper portion 219 and the lower portion 221 contacting eachother.

The upper pneumatic cylinder 223 and the lower pneumatic cylinder 226 are operable to engage, i.e., apply pressure to, the upper stiffener flexure 232 and the lower stiffener flexure 236. The initial reaction forces applied to the IPS 110 by the upper pneumatic cylinder 223 and the lower pneumatic cylinder 226 during engagement are minimal due to perpendicular instruction of the upper stiffener flexure 232 and the lower stiffener flexure 236 to the joint 214. In one embodiment, which can be combined with other embodiments described herein, the initial reaction force is about 20N or less per each stiffener 216 of the one or more stiffeners 216.

In one embodiment, which can be combined with other embodiments described herein, the one or more stiffeners 216 include the lens stiffener 222. The lens stiffener includes a lens housing 229, a lens pneumatic cylinder 228, and a lens stiffener flexure 242. In one embodiment, which can be combined with other embodiments described herein, the lens stiffener 222 is coupled to the lower portion 221 of the stiffener mount 224a or the stiffener mount 224b (as shown in FIGS. 2A and 2B). In another embodiment, which can be combined with other embodiments described herein, the lens stiffener 222 is coupled directly to the support bridge 250. The lens housing 229 includes the lens pneumatic cylinder 228 disposed therein. The lens stiffener 222 utilizes the lens stiffener flexure 242 to contact the lens 244 of the IPS 110. The lens stiffener flexure 242 is an attachment configured to contact the lens 244. The lens pneumatic cylinder 228 is operable to engage, i.e., apply pressure to, the lens stiffener flexure 242. In one embodiment, which can be combined with other embodiments described herein, the lens pneumatic cylinder 228 will include a cushioned end to ensure the lens 244 is not impacted during engagement of the lens stiffener 222. The lens stiffener 222 is preloaded to be in contact with the lens 244 and locked into positon. The lens stiffener 222 improves stability of the lens 244 despite vibrations during processing. The lens stiffener 222 may be positioned such that the lens pneumatic cylinder 228 moves in a horizontal direction (i.e., the x direction). The lens pneumatic cylinder 228 moves in a direction perpendicular to the support bridge 250 and the IPS bridge 260.

A pneumatic system control 246 is coupled to the one or more stiffeners 216. The pneumatic system control 246 is designed to communicate with the one or more stiffeners 216 when to actuate the upper pneumatic cylinder 223, the lower pneumatic cylinder 226, and the lens pneumatic cylinder 228 into an extracted position. In one embodiment, which can be combined with other embodiments described herein, the pneumatic system control 246 is in communication with the controller 122. The pneumatic system control 246 can communicate with the controller 122 such that the projection stabilization system 200 is integrated with the operation of the maskless lithography system 100. The controller 122 is operable to facilitate the extraction of the upper pneumatic cylinder 223, the lower pneumatic cylinder 226, and the lens pneumatic cylinder 228 into an extracted position before, during, and after processing.

In summation, projection stabilization systems and maskless lithography systems having projection stabilization systems are provided herein. The projection stabilization system compensates for propagating vibrations that move image projection systems (IPS's), leading to decreased performance of the IPS. The IPS's are in a processing positon prior to operation of the maskless lithography process. One or more stiffeners are coupled to the IPS. The one or more stiffeners apply pressure to flexures coupled to each stiffener on one end. The flexures are coupled to the IPS on the other end to provide stabilization to the IPS during the operations of the maskless lithography process. For example, the one or more of stiffeners protect the IPS from vibrations that propagate through the system during operation. The vibrations disrupt the focus of the IPS and lead to mura or other undesirable effects in the display. The projection stabilization system retains the IPS in the processing positon despite the vibrations. Additionally, the one or more stiffeners provide minimal reaction forces to the IPS, as well as provide stability.

While the foregoing is directed to examples of the present disclosure, other and further examples of the disclosure may be devised without departing from the basic scope thereof, and the scope thereof is determined by the claims that follow.

What is claimed is:

1. A system, comprising:
   a pair of bridges, each bridge disposed in a vertical direction adjacent to the other;
   a stiffener mount coupled to a first bridge of the pair of bridges;
   a joint coupled to a second bridge of the pair of bridges;
   an upper base coupled to an upper portion of the stiffener mount;
   an upper stiffener flexure disposed on the upper base;
   an upper stiffener coupled to the upper portion of the stiffener mount, the upper stiffener including an upper pneumatic cylinder positioned above the upper stiffener flexure;
   a lower base coupled to a lower portion of the stiffener mount;
   a lower stiffener flexure disposed on the lower base; and
   a lower stiffener coupled to the lower portion of the stiffener mount, the lower stiffener including a lower pneumatic cylinder positioned above the lower stiffener flexure, wherein the lower stiffener flexure is perpendicular to the joint.

2. The system of claim 1, further comprising an XY stage coupled to an upper surface of the second bridge, the XY stage operable to travel along the second bridge in an X direction and a Y direction.

3. The system of claim 2, further comprising a rear block disposed on the XY stage, the rear block including an interface flexure.

4. The system of claim 1, wherein the upper stiffener flexure and the lower stiffener flexure include a stainless steel material.

5. The system of claim 1, wherein the upper stiffener flexure and the lower stiffener flexure include multiple flexures stacked together.

6. The system of claim 1, further comprising a lens stiffener coupled to the lower portion of the stiffener mount, the lens stiffener including a lens pneumatic cylinder.

7. The system of claim 1, wherein the upper portion and the lower portion of the stiffener mount are separated.

8. The system of claim 1, wherein the upper portion and the lower portion of the stiffener mount are contacting each other.

9. A system, comprising:
   a stiffener mount;
   an upper base coupled to an upper portion of the stiffener mount;
   an upper stiffener flexure disposed on the upper base;
   an upper stiffener coupled to the upper portion of the stiffener mount, the upper stiffener including an upper pneumatic cylinder positioned above the upper stiffener flexure;
   a lower base coupled to a lower portion of the stiffener mount;
   a lower stiffener flexure disposed on the lower base; and
   a lower stiffener coupled to the lower portion of the stiffener mount, the lower stiffener including a lower pneumatic cylinder positioned above the lower stiffener flexure.

10. The system of claim 9, further comprising a lens stiffener coupled to the lower portion of the stiffener mount, the lens stiffener including a lens pneumatic cylinder.

11. The system of claim 10, wherein the lens stiffener includes a cushioned end on the lens pneumatic cylinder.

12. The system of claim 9, wherein the upper stiffener flexure and the lower stiffener flexure include a stainless steel material.

13. The system of claim 9, wherein the upper stiffener flexure and the lower stiffener flexure include multiple flexures stacked together.

14. The system of claim 9, wherein the upper portion and the lower portion of the stiffener mount are separated.

15. The system of claim 9, wherein the upper portion and the lower portion of the stiffener mount are contacting each other.

16. A system, comprising:
   a plurality of image projection systems disposed between a first bridge and a second bridge, each image projection system (IPS) having a joint coupled to the second bridge;
   a plurality of projection stabilization systems, each projection stabilization system coupled to a respective IPS, each projection stabilization system comprising:
   one or more stiffeners, each stiffener having:
      a housing coupled to the first bridge with a stiffener mount, the housing having a pneumatic cylinder disposed therein; and
      a base coupled to the housing; and
   one or more flexures, each flexure coupleable to the base of the respective stiffener and an IPS mount of the respective IPS, wherein each flexure is perpendicular to the joint coupling the respective IPS to the second bridge.

17. The system of claim 16, wherein the one or more stiffeners includes an upper stiffener coupled to an upper portion of the stiffener mount.

18. The system of claim 16, wherein the one or more stiffeners includes a lower stiffener coupled to a lower portion of the stiffener mount.

19. The system of claim 16, wherein the one or more flexures include a stainless steel material.

20. The system of claim 16, wherein the one or more flexures include multiple flexures stacked together.

* * * * *